United States Patent
Chang et al.

(10) Patent No.: US 6,197,481 B1
(45) Date of Patent: Mar. 6, 2001

(54) WAFER ALIGNMENT MARKS PROTECTED BY PHOTORESIST

(75) Inventors: Chen-Yu Chang; Wei-Kay Chiu, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/154,844

(22) Filed: Sep. 17, 1998

(51) Int. Cl.⁷ .............................. G03F 7/00; H01L 21/76
(52) U.S. Cl. ...................... 430/314; 430/22; 430/312; 438/401
(58) Field of Search ..................... 430/22, 314, 312; 438/401

(56) References Cited

U.S. PATENT DOCUMENTS

| | | | |
|---|---|---|---|
| 4,233,091 | * 11/1980 | Kawabe | 148/175 |
| 4,657,379 | 4/1987 | Suwa | 355/53 |
| 4,778,275 | 10/1988 | van den Brink et al. | 356/401 |
| 5,442,445 | 8/1995 | Tatsumo et al. | 356/401 |
| 5,451,529 | * 9/1995 | Hsu | 437/8 |
| 5,695,897 | 12/1997 | Mitome et al. | 430/22 |
| 5,893,744 | * 4/1999 | Wang | 438/401 |

FOREIGN PATENT DOCUMENTS 59-100525 * 6/1998 (JP) .

OTHER PUBLICATIONS

P. Ria–Choudburg. "Handbook of Microlithography Micromaching 8 Microfabrication", vol. 1 Microlithography SPIE Press, 1997, p 96.

* cited by examiner

Primary Examiner—Mark F. Huff
Assistant Examiner—Nicole Barreca
(74) Attorney, Agent, or Firm—George O. Saile; Stephen B. Ackerman

(57) ABSTRACT

In this invention a coating of unexposed photoresist is used to protect from semiconductor processing the area immediately above a zero layer alignment mark used for a wafer stepper alignment. The entire surface of a wafer is coated with photoresist and all shot sites on the surface of a wafer including those containing the zero layer alignment marks are exposed with circuit patterns. Before the exposed areas of photoresist are removed, a protective coating of unexposed photoresist is applied to the surface of the wafer immediately above the alignment marks but within the boundaries of the shot site. The wafer is processed in the areas outside of the protective coating of photoresist including the shot site containing alignment marks. The area under the protective coating is not processed. This maintains a clear and concise view of the alignment marks. The area beyond the protective coating is processed along with the other shot sites. This produces a homogeneous wafer structure at the peripheral of the shot site containing the alignment marks. Yield in the shot sites surrounding the alignment sites is improved, and alignment errors are reduced as a result of not processing over the alignment marks.

4 Claims, 3 Drawing Sheets

WAFER ALIGNMENT MARKS PROTECTED BY PHOTORESIST

BACKGROUND OF THE INVENTION

1. Field of Invention

The field of this invention is related to semiconductor processing and in particular making wafer alignment marks clear and concise throughout the many steps of wafer processing.

2. Description of Related Art

Several wafer alignment strategies exist using different patterns and locations to achieve the alignment of a semiconductor wafer to a mask containing an image to be transferred to the wafer. These strategies vary from alignment marks located between shot sites (also known as chip sites) to global alignment marks located in two shot sites near the peripheral of the wafer. There are also global strategies in which the alignment marks are located between shot sites in the more peripheral regions of the wafer. Care must be given to maintaining the integrity of these alignment marks to provide adequate alignment of masks to the semiconductor wafer throughout the processing of the wafer so as to provide the best possible device yield.

In U.S. Pat. No. 5,695,897 (Mitome et al.) an alignment method is described in which a first stepper having a first magnification reduction and a second stepper having a second magnification are used. The first stepper is used for global alignment and the second stepper is used in relation with each individual shot site. The alignment marks are located between shot sites. In U.S. Pat. No. 5,442,445 (Tatsuno et al.) is described an alignment method for registering a target with respect to a predetermined reference position. This system uses a registration marks formed on the target object. In U.S. Pat. No. 4,778,275 (van den Brink et al.) a method of aligning a mask pattern with a substrate is described. Two alignment marks are used by two separate alignment systems which are each associated with one alignment mark. In U.S. Pat. No. 4,657,379 (Suwa) describes a method and exposure mask to perform alignment of the mask to a wafer without decreasing throughput. A pair of mark regions contain alignment marks that cross the mark region. The alignment mark regions are located at two sides of the pattern region of the mask image. In the "Handbook of Microlithography, Micromachining and Microfabrication", edited by P. Rai Chaudhury, Copublished by The international Society for Optical Engineering and The Institute of Electrical Engineers, 1997, page 96 discusses the ASM-L stepper which uses a zero layer alignment strategy that uses alignment marks etched directly into bare silicon before any other processing.

A global alignment system, similar to the ASM-L alignment system, is the focus of this invention. The global alignment system is a simple strategy to implement and has high throughput, but requires an extra processing step. The zero layer alignment marks are small 10×8 mm and occupy only a small portion of a shot site. The shot site containing the zero layer alignment marks is blank other than the alignment marks and provides a different topology to the surrounding shot sites which have full circuit images. This difference in topology causes yield problems ranging from loading problems with photoresist and etch to bad focus errors caused by the topology over the mark region from processing the wafer.

SUMMARY OF THE INVENTION

In this invention a shot site containing zero layer alignment marks used with a wafer stepper, for example the ASM-L stepper, is covered with photoresist and exposed like every other shot site on the wafer. Then a small amount of photoresist is placed over the exposed photoresist that is over the zero layer alignment marks. The alignment marks are located in two places on opposite sides of the wafer and were etched into a thin layer of oxide initially grown on the wafer. The size of the alignment mark is 2×1.6 mm which is small with respect to the shot site, and it is easy to add a small amount of photoresist above the alignment mark without interfering with the surrounding product shot sites.

After the exposed photoresist is removed and the wafer is processed by etching, ion implantation or other processing means, the remaining photoresist is removed from the wafer leaving a bare alignment mark. Then additional photoresist is applied, and the shot sites are exposed with additional circuit patterns of the product being created on the wafer. After each exposure of the photo resist, a small amount of photoresist is placed over the alignment marks and the exposed photoresist covering the alignment marks. The exposed photoresist not covered by the small amount of photoresist is removed. The wafer is processed and again the remaining photoresist is removed exposing bare alignment marks. Each time alignment of additional masks is required the alignment process is done with alignment marks that are clear and free of any distortions that might be provided by the preceding processing steps.

An applicator to automatically dispense the photoresist over the alignment marks is constructed of a device having a small diameter tube extending in a vertical orientation over a wafer and wafer holder connected to a wafer stepper. The vertical angle of the small diameter tube with respect to the surface of the wafer is ninety degrees or less. The tube is connected to a reservoir of photoresist through a control valve. The control valve is opened long enough to dispense a controlled amount of photoresist onto the surface of the wafer over the location of the alignment marks. The controlled amount of photoresist is enough to cover the area above the alignment marks but not enough to disturb the processing of circuit patterns in the surrounding shot sites. The stepper knowing the locations of the shot sites containing the alignment marks steps from one shot site containing an alignment mark to another and dispenses the controlled amount of photoresist over the alignment marks on each site.

A wafer with alignment marks contained within shot sites is coated with a first layer of photoresist. Circuit patterns are exposed onto the first layer of photoresist of each shot site including the shot sites containing the alignment patterns. Before removing the exposed photo resist in the first layer of photoresist, a controlled small amount of photoresist is dispensed over the alignment marks in a second layer of photoresist. The second layer of photoresist is not exposed and covers the first layer of photoresist above the wafer alignment marks that is exposed. When the exposed photoresist on the wafer is removed, the exposed photoresist under the second layer is not removed and no processing of circuit patterns is done above the alignment marks. Beyond the second layer of photoresist and within the shot site containing the alignment marks circuitry patterns are processed like any other shot site not containing alignment marks. This forms a homogeneous structure within the edges around the peripheral of the shot site containing the alignment marks and produces an increased yield in the surrounding chips because problems with differences in topology are eliminated such as bad focus errors, loading effects of photoresist and problems associated with shifting the alignment patterns to solve the original set of problems.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
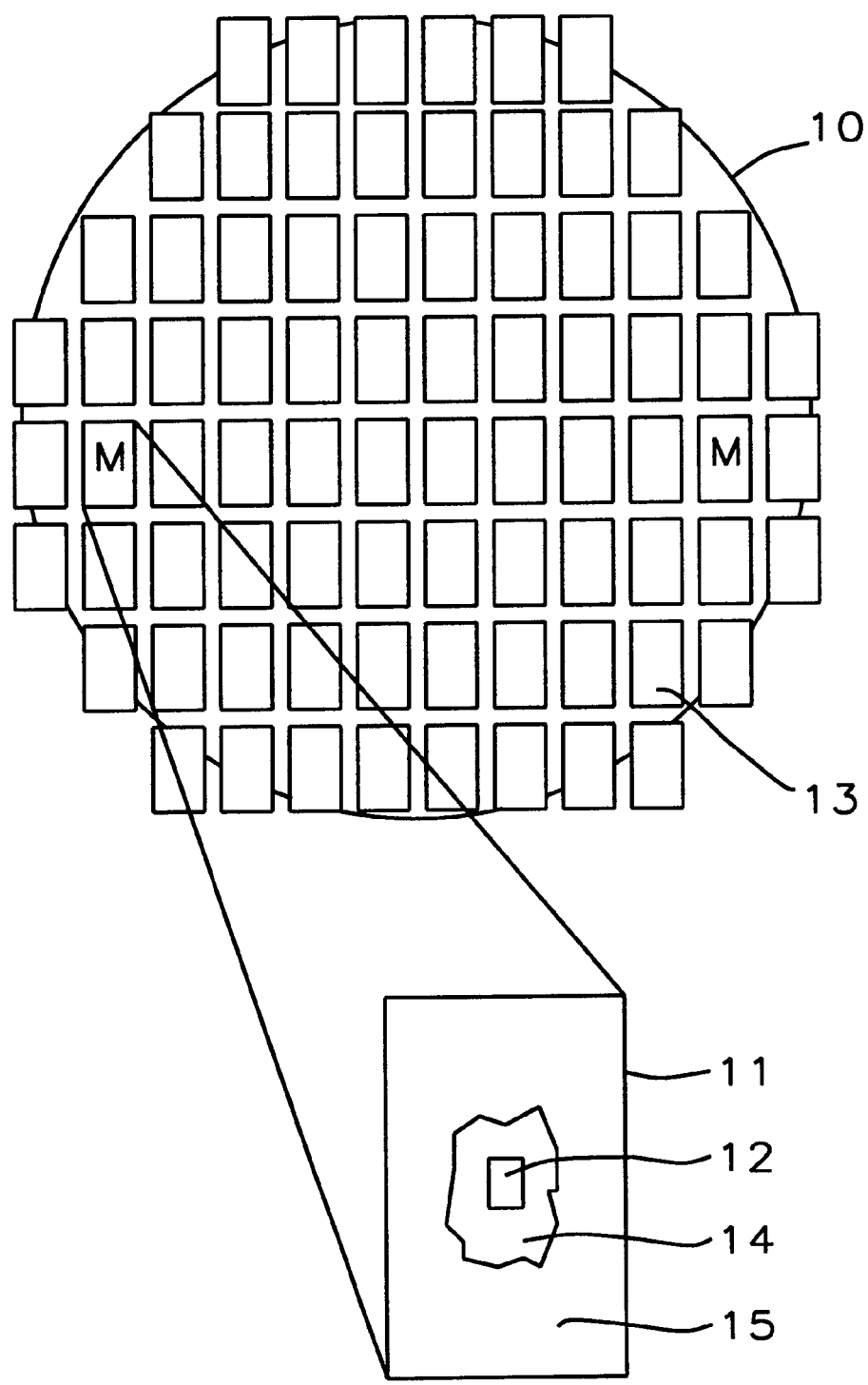
FIG. 1 is a diagram of a wafer showing shot site locations used for alignment marks.

Shown in FIG. 1 is a diagram of a wafer 10 using a global alignment strategy for a wafer stepper. Two shot sites marked with an "M" are located to the right and left of center and close to the peripheral of the wafer 10. An exploded view of a shot site 11 is shown containing an area for the alignment marks 12. A thin layer of oxide is grown on a bare semiconductor substrate and the alignment marks 12 are etched into the oxide before other processing is done. Photoresist is applied to the whole surface of wafer 10 and circuit patterns are exposed onto each shot site represented by 11 and 13 using a wafer stepper, for example an ASM-L stepper or equivalent. Before the exposed photoresist is removed a controlled amount of photo resist 14 is dispensed above the alignment marks 12 on shot sites marked with an M. The controlled amount of photoresist 14 is not exposed to circuit patterns and protects the exposed portions of the underlying photoresist from being removed. Wafer processing is done in the areas where exposed photoresist is not protected and is removed from the surface of the wafer. The area 15 between the dispensed protective photoresist 14 and the edge of the shot site 11 is process normally as with all other shot sites 13 not containing alignment marks. This provides a homogeneous wafer environment to the shot sites surrounding the alignment site M and increases yield in the surrounding sites. After wafer processing all remaining photoresist is removed producing bare alignment marks 12 ready for the next set of process steps.

Figure 2:
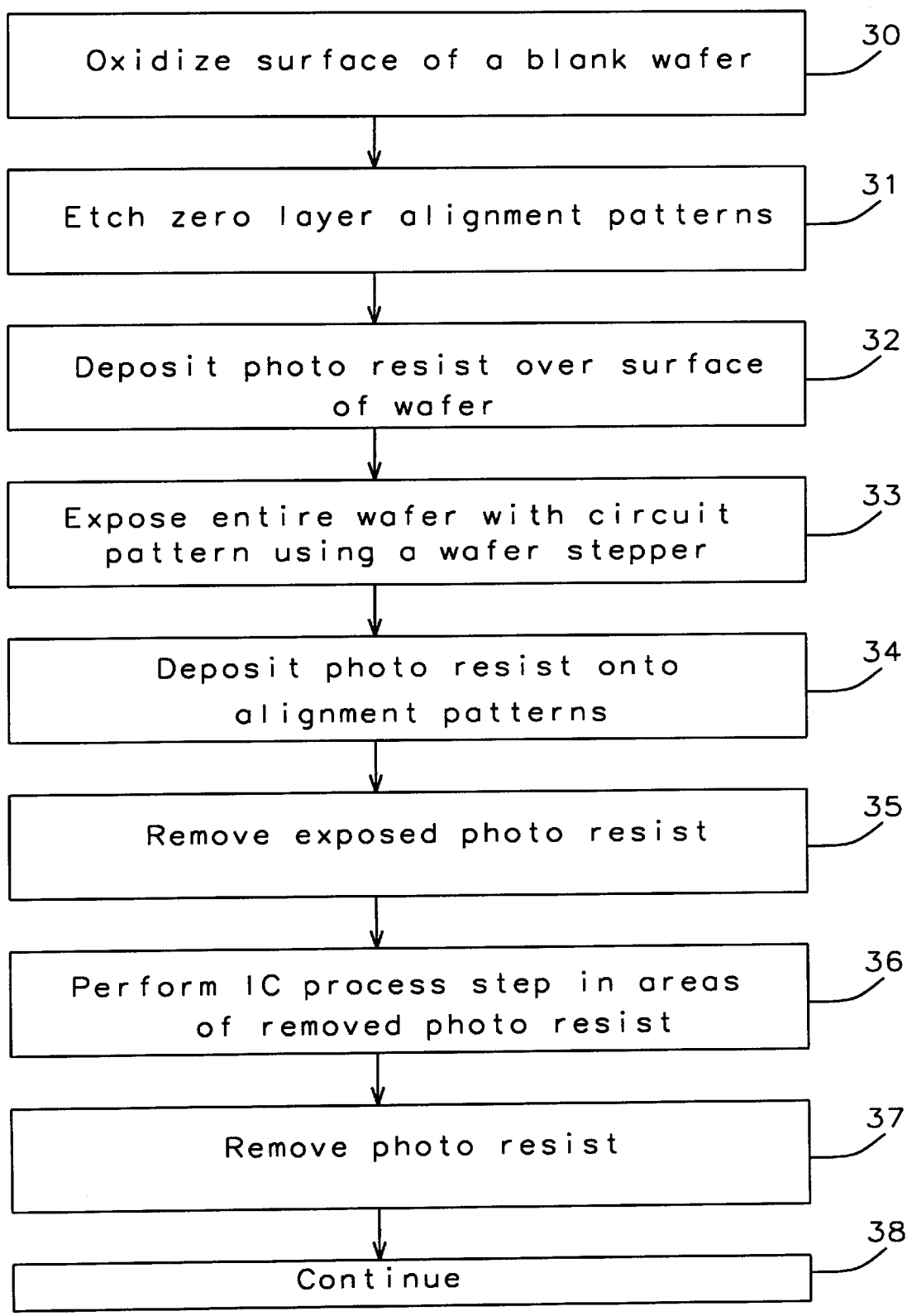
FIG. 2 is the flow diagram of the process to protect the alignment marks by the addition of unexposed photoresist.
Figure 3:
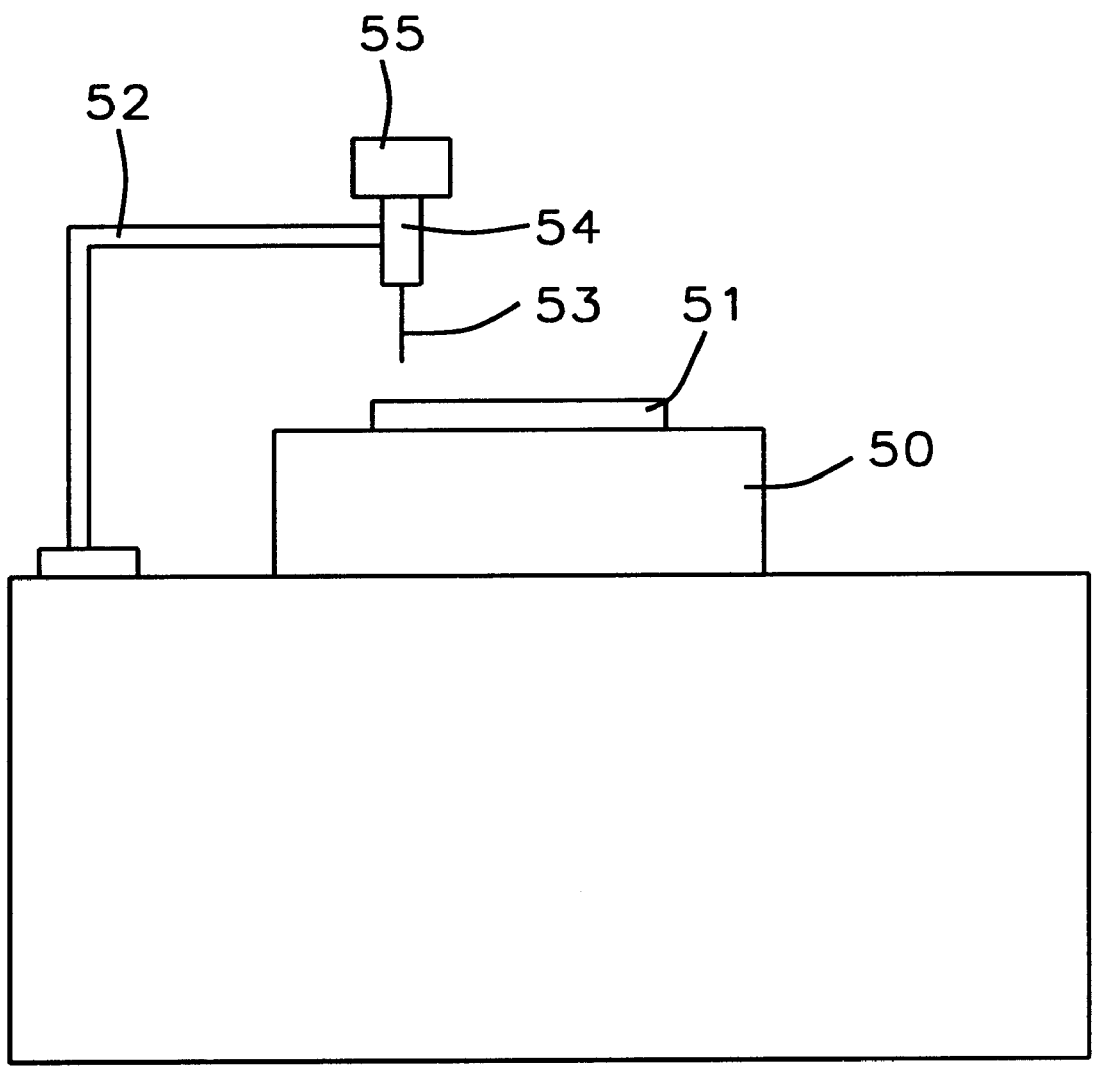
FIG. 3 is a simplified diagram of an automatic dispenser of photoresist over the alignment marks.

In FIG. 2 is shown the process flow for the method of protecting the alignment marks 12 from further processing and providing a homogeneous wafer surface around the peripheral of the alignment pattern shot site M. The surface of a blank wafer is oxidized 30, and zero layer alignment patterns are etched into the oxide coating of the wafer. These alignment patterns are etched into two shot site locations on opposite sides of the wafer. Photoresist is deposited onto the surface of the wafer 32, and the entire wafer is exposed with circuit patterns using a wafer stepper 33, for example an ASM-L stepper or equivalent. This includes exposing the photoresist over the alignment marks. It should be noted that other wafer steppers having similar capability and characteristics to the ASM-L stepper could be used for stepping the circuit patterns over the surface of the wafer from shot site to shot site. A controlled amount of photoresist is deposited onto the surface of the wafer above the alignment marks 34 to protect the underlying exposed photoresist. This protects the exposed portion of the photo resist above the alignment marks from being removed and further processed. The portion of the exposed photoresist that is out from under the protective coating of photoresist is removed as is exposed photoresist of the rest of the wafer 35 . Integrated circuit processing is performed in regions of removed photo resist 36. After the step in integrated circuit processing is complete, all photoresist is removed from the surface of the wafer 37 and the processing of the wafer continues 38. If additional photoresist application is required the process returns to step 32 and again a protective coating of photoresist is used to protect from processing those exposed areas above the alignment marks.

in FIG. 3 is shown a simplified drawing of an automatic applicator for the controlled application of protective photoresist over alignment marks on a wafer. A wafer stepper 50 holds a semiconductor wafer 51. Held above the wafer 51 by means of an arm 52 or any other appropriate holding devices is an applicator comprising a small tube 53 connected to a reservoir 55 through a control valve 54. The small tube 53 is oriented vertically to the wafer 51 with an angle with respect to the surface of the wafer of ninety degrees or less. The wafer 51 is aligned with the wafer stepper 50 positioning capability. The stepper 50 aligns the wafer alignment mark under the small tube 53 so that a controlled amount of photoresist can be applied to the surface of the wafer directly above the alignment mark. The control valve 54 is opened momentarily and a controlled amount of photoresist is dispensed onto the surface of the wafer covering the area directly above the alignment marks but not beyond the peripheral of the shot site containing the alignment marks. The wafer stepper 50 then steps to the next shot site containing an alignment mark and dispenses a controlled amount of protective photoresist through the applicator comprising the small tube 53 connected to a reservoir 55 through a control valve 54.

While the invention has been particularly shown and described with reference to preferred embodiments thereof, it will be understood by those skilled in the art that various changes in form and details may be made without departing from the spirit and scope of the invention.

What is claimed is:

1. A method to protect wafer alignment marks, comprising the steps of:
    a) consisting of oxidizing a surface of a blank wafer and then etching a zero layer alignment pattern into said wafer at a first chip site and a second chip site, then,
    b) depositing a first application of photoresist over the entire surface of said wafer and exposing all chip sites on the entire wafer including said first and second chip site with a circuit pattern, then,
    c) depositing a second application of photoresist onto an area over said alignment pattern at said first and second chip site to cover exposed photoresist over said alignment pattern, then,
    d) removing the exposed photoresist from surface of wafer that is not covered with said second application of photoresist, and performing wafer processing in areas of the removed photoresist, then,
    e) removing remainder of photoresist from said wafer,
    f) ending else depositing an additional application of photoresist over entire surface of said wafer and exposing all chip sites on the entire wafer including said first and second chip site with a circuit pattern, then, returning to step c if additional wafer processing requiring photoresist and photolithography is needed.

2. The method of claim 1, wherein depositing a second application of photoresist over said alignment pattern is done on said first and said second chip sites located on opposite sides of said wafer.

3. The method of claim 1, wherein depositing a second application of photoresist over said alignment pattern on said first and said second chip sites is done with a small tube connected by means of a control valve to a photoresist reservoir when said small tube is positioned over said alignment pattern.

4. The method of claim 1, wherein depositing a second application of photoresist over said alignment pattern on said first and said second chip sites is done using any stepper with alignment and stepping control capable of positioning a photoresist applicator comprising a small tube, a control valve and a photoresist reservoir over said alignment pattern.

* * * * *